United States Patent [19]

Nikaido et al.

[11] Patent Number: 5,157,107

[45] Date of Patent: Oct. 20, 1992

[54] HEAT-RESISTANT INSULATING COATING MATERIAL AND THERMAL HEAD MAKING USE THEREOF

[75] Inventors: Masaru Nikaido, Miura; Hikaru Okunoyama, Yokohama; Katsumi Yanagibashi, Yokohama; Yoshiaki Ouchi, Yokohama, all of Japan

[73] Assignees: Kabushiki Kaisha Toshiba, Kanagawa; Toshiba Chemical Corporation, Tokyo, both of Japan

[21] Appl. No.: 400,086

[22] Filed: Aug. 29, 1989

Related U.S. Application Data

[62] Division of Ser. No. 150,231, Jan. 29, 1988, Pat. No. 4,868,584.

[30] Foreign Application Priority Data

Jan. 31, 1987 [JP] Japan ................. 62-021431

[51] Int. Cl.$^5$ ............... C08G 69/26; C08G 73/10; C08G 77/04
[52] U.S. Cl. .................... 528/353; 528/26; 528/33; 528/38; 528/125; 528/128; 528/170; 528/172; 528/173; 528/176; 528/183; 528/185; 528/188; 528/220; 528/229; 528/350; 528/351; 427/387
[58] Field of Search ............ 528/26, 38, 125, 183, 528/185, 128, 170, 172, 173, 188, 322, 351, 220, 350, 353, 229; 427/387

[56] References Cited

U.S. PATENT DOCUMENTS

| | | | |
|---|---|---|---|
| Re. 33,342 | 9/1990 | Kohtoh et al. ................ | 428/1 |
| 4,161,477 | 7/1979 | Long et al. .................... | 528/125 |
| 4,183,838 | 1/1980 | Gagliani ........................ | 528/125 |
| 4,183,839 | 1/1980 | Gagliani ........................ | 528/125 |
| 4,469,409 | 9/1984 | Nakano et al. ................ | 350/341 |
| 4,520,075 | 5/1985 | Igarashi et al. ............... | 528/26 |
| 4,645,688 | 2/1987 | Makino et al. ................ | 528/26 |
| 4,749,777 | 6/1988 | Kohtoh et al. ................ | 428/1 |
| 4,868,584 | 9/1989 | Nikaido et al. ............... | 428/473.5 |

OTHER PUBLICATIONS

CA 103(6):46815t JP. 60007153 Jan. 14, 1985 Showa.
"Decision of the Technical Board of Appeal 3.3.1 dated Feb. 9, 1982, T 12/81", Bayer AG; Official Journal EPO, pp. 296-305.
Encyclopedia of Polymer Science and Engineering, vol. 4, "Composites, Fabrication to Die Design", pp. 285-286.

Primary Examiner—John Kight, III
Assistant Examiner—P. Hampton-Hightower
Attorney, Agent, or Firm—Finnegan, Henderson, Farabow, Garrett and Dunner

[57] ABSTRACT

A polymeric acid is synthesized by the ring-opening poly-addition reaction using a biphenyl tetracarboxylic acid as a tetracarboxylic acid moiety and an aromatic diamine, particularly p-phenylene diamine, as a diamine moiety. An aromatic polyimide resin layer possessing a highly desirable heat-resisting property as a heat-resistant insulating coating material and excelling in adhesive strength relative to a substrate is obtained by adjusting the polymeric acid in viscosity with a suitable organic solvent, applying the resultant polyamic acid on a substrate, and firing the applied layer of the polyamic acid. The substrate, for example, is a conductor layer formed as with copper and used as a multi-layer wiring board for hybrid IC's. In a thermal head which is obtained by forming an insulating layer on a metallic substrate and superposing a multiplicity of heat-generating resistors and conductors connected severally to the heat-generating resistors on insulating layer, the aforementioned aromatic polyamide resin layer is formed on the metallic substrate. This aromatic polyimide resin layer as an insulating layer in the thermal head withstands harsh working temperature conditions and adheres strongly to the metallic substrate. Thus, it manifests various outstanding effects.

8 Claims, 6 Drawing Sheets

HEAT-RESISTANT INSULATING COATING MATERIAL AND THERMAL HEAD MAKING USE THEREOF

This is a division of application Ser. No. 150,231, filed Jan. 29, 1988 now U.S. Pat. No. 4,868,584.

The present application claims priority of Japanese Patent Application No. 62-021431 filed on Jan. 31, 1987.

FIELD OF THE INVENTION AND RELATED ART STATEMENT

This invention relates to a heat-resistant coating material excelling in adhesiveness to metallic parts and ceramic parts and exhibiting outstanding resistance to heat and to a thermal head obtained by forming on a metallic substrate an insulating layer made of the heat-resistant coating material mentioned above and depositing on the insulating layer a multiplicity of heat-generating resistors.

In recent years, the thermal head has been finding growing utility in various recording devices such as facsimile devices and word processor printers because it enjoys many advantages such as small noise, no need of maintenance, and low running cost. In the meantime, these recording devices are required to offer benefits of reduced size, lowered price, and decreased power consumption. As a natural consequence, the thermal heads to be used in these devices are expected to offer merits of reduced size and lowered price and improved efficiency.

Of the thermal heads of this class, those which are produced by forming a glazed glass layer on an alumina ceramic substrate having an $Al_2O_3$ purity of not less than 90% and depositing on the glazed glass layer a multiplicity of heat-generating resistors and conductors connected severally to the resistors have been finding particularly popular acceptance. In these thermal heads, the glazed glass layer fulfils its function as an insulating layer for controlling release and storage of heat.

The thermal heads of the type using the glazed layer as an insulating layer, however, entail the following drawbacks.

(1) The thermal head suffers from low operational efficiency because the glazed glass as the insulating layer possesses a limited thermal response characteristic.

(2) The ceramic substrate, during the course of its manufacture, requires many manufacturing steps such as the treatment for removal of alkaline metal component from the powdered raw material, the firing at an elevated temperature, and the finishing abrasion for relieving the substrate of the work produced during the treatment of firing at the elevated temperature. Also the glazed glass requires the step of removing the alkaline metal component from the powdered raw material. The thermal head, therefore, entails a high production cost.

(3) Where the thermal head is to be designed in the vertical structure in place of the conventional horizontal structure so as to meet the demand for size reduction, the process of manufacture thereof is inevitably complicated because such component members of the thermal head as the alumina substrate and the glazed glass show no malleability in the later steps of operation such as bending, for example.

As a means for solving such drawbacks as mentioned above, the method of using a polyimide resin of small thermal diffusion coefficient for the insulating layer in the thermal head has been known to the art as disclosed in Japanese Patent Application Disclosures SHO 52(1977)-100,245 and SHO 56(1981)-164,876, for example.

Recently, there has been proposed a vertical thermal head fit for size reduction, obtained by a process which comprises forming an insulating layer of a polyimide resin on a thin metal sheet, depositing a multiplicity of heat-generating resistors on the insulating layer thereby preparing a flat thermal head tentatively, and bending this flat thermal head in such a manner that a heat generating part will be located on the top of a metal member destined to serve as a substrate and, at the same time, joining the bent flat thermal head to the metal member (U.S. Pat. No. 4,626,872 and the Glossary of Manuscripts for the 1986 Joint National Meeting of the Society of Electronic Telecommunication (1986), 1–125 and 5–128).

This polyimide resin has a thermal diffusion coefficient as low as one third to one sixth of that of the glazed glass which has been heretofore used for the insulating layer and, therefore, enables the thermal head to acquire a notably enhanced thermal efficiency. It is also bendable. Thus, the polyimide resin permits the thermal head to be reduced in size.

This polyimide resin is useful not only for the insulating layer in the thermal head but also for the heat-resistant insulating coating material in various electronic devices such as, for example, the insualting layer in the multi-layer wiring board for hybrid IC's.

The thermal head using this polyimide resin in the insulating layer, however, has a disadvantage that it is incapable of effecting a printing operation stably for a long period of time.

This is because none of the polyimide resins so far developed simultaneously possesses the heat resisting property enough to withstand stably the working conditions of the thermal head destined to be exposed to temperatures of 400° to 500° C. momentarily and to temperatures of 250° to 350° C. normally and the highly desirable adhesiveness to be exhibited to the thin layer formed on the metal substrate and the polyimide resin without being degraded by repeated application of heat.

When the heat-resisting property is inferior, the polyimide resin naturally undergoes thermal deterioration during the course of use and entails degradation of quality. When the adhesive strength is insufficient, the polyimide resin layer is liable to be separated during the course of use. These adverse effects cooperate to impair the reliability of the thermal head.

Japanese Patent Application Disclosure SHO 56(1981)-164,876, for example, mentions a polyamic acid solution, called "Torayneece" (trademark designation) in a working example cited therein. When this solution was applied on aluminum substrates and the applied layers of the solution were fired under the varying conditions of 50° C.×60 minutes, 80° C.×30 minutes, 120° C.×30 minutes, 250° C.×60 minutes, and 450° C.×60 minutes to produce polyimide resin layers, these polyimide resin layers were found by the thermogravimetry to start undergoing thermal decomposition at about 510° C. Despite such fairly high heat-resisting property, they exhibited no sufficient adhesive strength and were readily separated even at such mild heating conditions. Thus, they are hardly fit for use in the thermal head. A polyimide resin called "Pyre-ML" (trademark designation) has been known to possess relatively satisfactory adhesiveness. A thermal head was formed with an aluminum substrate having superposed thereon a layer of this polyimide resin and operated for application of $10^5$ pulses of voltage under the conditions of 0.26 mJ/dot of applied energy, 1.7 ms of pulse width, and 5.0 ms of pulse cycle. At the end of this operation, the surface of the polyimide resin layer was observed under a scanning acoustic microscope. A photomicrograph of the surface taken through this microscope is shown in FIG. 7. It is clearly noted from this photomicrograph that the layer was degenerated so much as to sustain a rugged surface during the course of the operation. By the thermogravimetry, this polyimide resin layer was found to yield to thermal decomposition at a low temperature of about 420° C. Thus, this polyimide resin layer proved to be hardly serviceable for the thermal head.

In all the problematic points posed by the polyimide resin, the deficiency in adhesive strength and the degeneration of the polyimide resin layer due to repeated application of heat constitute themselves serious drawbacks not merely for the thermal head but equally for the heat-resistant insulating coating material such as is used for the insulating layer in the multi-layer wiring board for hybrid IC's as mentioned above.

As described above, the conventional polyimide resins do not fulfil the function with due reliability for a long period of time because they fail to offer a lasting stable heat-resisting property enough to withstand the harsh working temperature conditions and lack the adhesive strength required to be manifested with the metallic substrate.

OBJECT AND SUMMARY OF THE INVENTION

An object of this invention, therefore, is to provide a heat-resistant insulating coating material possessing a heat-resisting property enough to withstand the harsh working temperature conditions and exhibiting enhanced adhesive strength to metallic parts.

Another object of this invention is to provide an inexpensive and highly reliable thermal head which comprises a metallic substrate and an insulating layer formed thereon with a heat-resistant insulating coating material of enhanced thermal resistance and which, therefore, excels in thermal efficiency, exhibits due malleability for the work of bending, and permits size reduction.

Yet another object of this invention is to provide an inexpensive and highly reliable thermal head which comprises a metallic substrate, an insulating layer formed thereon with a heat-resistant insulating coating material, and a thin layer of enhanced adhesive strength formed on the metallic substrate and the insulating layer and which, therefore, excels in thermal efficiency, exhibits sufficient malleability for the work of bending, and permits size reduction.

The heat-resistant insulating coating material of the present invention is characterized by comprising an aromatic polyimide resin formed by the dehydration cyclization reaction of a polyamic acid which is obtained by the ring-opening polyaddition reaction of biphenyl tetracarboxylic dianhydride and an aromatic diamine.

The thermal head of the present invention comprises a metallic substrate, an insulating layer formed with a heat-resistant resin on the metallic substrate, a multiplicity of heat-generating resistors formed on the insulating layer, and conductors connected severally to the heat-generating resistors, which thermal head is characterized by the fact that the insulating layer thereof substantially comprises an aromatic polyimide resin formed by the dehydration cyclization reaction of a polyamic acid which is obtained by the ring-opening polyaddition reaction of biphenyl tetracarboxylic dianhydride and an aromatic diamine.

The biphenyl tetracarboxylic dihydride which is one of the two starting materials for the polyamic acid, the precursor for the aromatic polyimide resin of the present invention is represented by the following general formula:

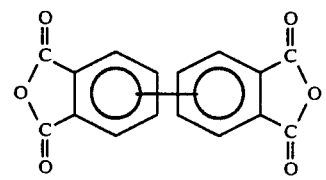

As concrete examples of the biphenyl tetracarboxylic dianhydride represented by the aforementioned general formula, there can be cited 3, 3', 4, 4'-biphenyl tetracarboxylic dianhydride and 2, 2', 3, 3'-biphenyl tetracarboxylic dianhydride.

As concrete examples of the aromatic diamine which is the other starting material, there can be cited p-phenylene diamine, m-phenylene diamine, diaminodiphenyl sulfone, diaminodiphenyl methane, and diaminodiphenyl ether. Substitution products of these aromatic diamines may be used instead. As substituents for these substitution products, there can be cited such lower alkyl groups as methyl group and ethyl group. As concrete examples of the substitute aromatic diamine, there can be cited 2,4-dimethyl-p-phenylene diamine and tetramethyl-p-phenylene diamine. It is particularly desirable to use p-phenylene diamine among other aromatic diamines cited above. This is because the aromatic polyimide resin which is formed by using p-phenylene diamine possesses a particularly high thermal decomposition temperature and a thermal expansion coefficient approximating the thermal expansion coefficients of metals and ceramics.

The aromatic polyimide resin layer of the present invention is formed, for example, by the following method.

First, a polyamic acid solution of desired concentration is prepared by subjecting a biphenyl tetracarboxylic dianhydride and an aromatic diamine to a ring-opening poly-addition reaction in a suitable organic solvent. For this reaction the diphenyl tetracarboxylic dianhydride and the aromatic used diamine are generally in equimolar amounts. The ratio of their amounts may be varied within the range of about ±7 mol % so long as the thermal resistance and the viscosity of the produced polyamic acid solution fall within the allowable ranges. The ring-opening polyaddition reaction is generally carried out at a temperature in the range of the room temperature to 50° C. in an atmosphere of dry nitrogen gas. As the organic solvent for the reaction, it is suitable to use a polar organic solvent such as, for example, N-methyl-2-pyrrolidone, N N'-dimethyl acetamide, or N.N'-dimethyl formamide.

Then, the polyamic acid solution obtained as described above is applied on a given surface, a metallic substarate in the case of a thermal head, and the layer of the solution consequently formed is caused by firing to undergo a dehydration cyclization reaction and give rise to an aromatic polyimide resin layer. The substrate on which this aromatic polyimide resin is to be used as an ordinary heat-resistant insulating coating material need not be limited to a metallic member. A ceramic member or a glass member may be used instead.

The aromatic polyimide resin layer which is formed by applying the polyamic acid solution on the substrate and firing the applied layer of the solution possesses highly desirable adhesive strength with the substrate because it is joined fast to the substrate at the same time that it is imidized.

Further, since the aromatic polyimide resin of the present invention possesses a biphenyl structure in the main chain thereof, it exhibits a small thermal shrinkage and a small thermal expansion coefficient sparingly different from the thermal expansion coefficient of metallic parts. As a result, the phenomenon of "separation" due to the thermal shrinkage caused by repeated application of heat and the thermal stress caused by difference in thermal expansion coefficient can be precluded. Further owing to the biphenyl structure in the main chain, the aromatic polyimide resin is excellent in thermal resistance.

The heat-resistant insulating coating material and the thermal head of the present invention are further advantageous in that the adhesiveness of the heat-resistant resin layer and the metallic substrate can be improved by any of the measures indicated in (1) through (3) below.

(1) Introduction of a Si group into the molecular structure of the polyimide type resin possessing a biphenyl structure in the main chain thereof. The polyimide type resin incorporating this Si group as described above is formed, for example, by using a polyamic acid which is obtained by substituting part of the aromatic diamine, preferably a proportion approximately in the range of 0.05 to 10 mol % of the aromatic diamine component, with Si group-containing diamine during the course of the synthesis of the aforementioned polyamic acid and subjecting the substituted aromatic diamine to the ring-opening poly-addition reaction.

As examples of the aforementioned Si group-containing diamine, there can be cited bis-aminosiloxanes represented by the general formula:

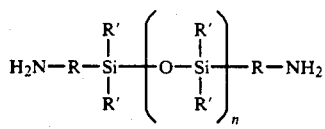

(wherein R stands for an alkylene group such as ethylene group or propylene group, a polymethylene group such as trimethylene group or tetramethylene group, or a divalent organic group such as phenylene group, R' for a monovalent organic group such as methyl group, ethyl group, or other similar alkyl group, and n for a positive number). Typical bisaminosiloxanes are shown below.

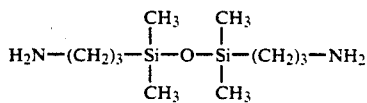

-continued

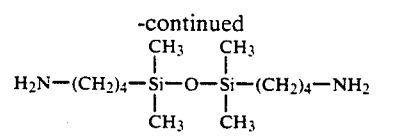

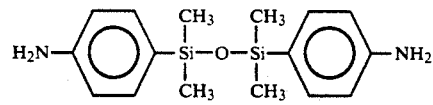

(2) Incorporation of at least either of an amino bond-containing silane compound and an urea bond-containing silane compound as a silane coupling agent component in the polyimide type resin possessing a biphenyl group in the main chain thereof. This incorporation of the silane coupling agent can be attained, for example, by adding to the aforementioned polyamic acid solution the aforementioned silane compound in a proportion approximately in the range of 0.05 to 10% by weight, based on the solids content of the polyamic acid solution.

As examples of the amino bond-containing silane compound to be added as a silane coupling agent component, there can be cited γ-aminopropyl triethoxy silane and N-phenyl-γ-aminopropyl trimethoxy silane. As one example of the urea bond-containing silane compound, γ-ureidopropyl trimethoxy silane can be cited.

(3) Interposition between the heat-resistant resin layer and the metallic substrate of an active metal layer such as Cr of Ti having a thickness approximately in the range of 500 to 10,000 Å.

The measure (1) relying on the incorporation of a Si group into the molecular structure of the polyimide resin and the measure (2) on the addition of a silane coupling agent to the polyimide resin, unlike the measure (3), obviate the necessity for adding to the number of steps of manufacture of the thermal head and, moreover, and capable of greatly improving the adhesiveness between the heat-resistant resin layer and the thin layer formed on the heat-resistant resin layer.

DETAILED DESCRIPTION OF PREFERRED EMBODIMENTS

Now, preferred embodiments of this invention will be described below with reference to the accompanying drawings.

Figure 1:
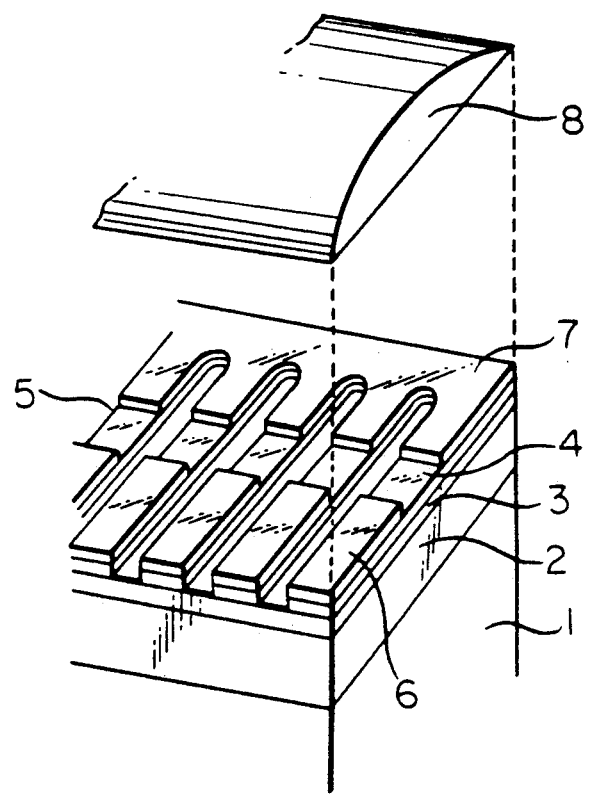
FIG. 1 is a partially disassembled perspective view illustrating the essential part of a typical thermal head using a heat-resistant insulating coating material of the present invention.

FIG. 1 is a partially disassembled perspective view illustrating the essential part of a typical thermal head using the heat-resistant insulating coating material, one embodiment of this invention, as an insulating layer.

In the diagram, the reference numeral 1 denotes a substrate formed with a Fe-Cr alloy in a thickness of about 0.5 mm. On this metallic substrate 1, an insulating layer 2 is formed in a thickness in the range of 5 to 50 μm, preferably 10 to 30 μm, with an aromatic polyimide resin whose main backbone is represented by the following formula (I-2) or (III-2) by applying thereon and firing either a polyamic acid solution having a Si group introduced into the molecular structure thereof as represented by the following formula (III-1), which polyamic acid solution is obtained by having a proportion in the range of 0.05 to 10 mol % of the p-phenylene diamine component substituted with a bisaminodisiloxane represented by the following formula (II) during the synthesis of the polyamic acid by the ring-opening polyaddition reaction in an organic solvent of equimolar amounts of a biphenyl tetracarboxylic dianhydride and a p-phenylene diamine or a polyamic acid solution represented by the following formula (I-1) having added to and dispersed in the solution a proportion in the range of 0.05 to 10% by weight of a γ-ureidopropyl trimethoxy silane represented by the following formula (IV), based on the solids content of the solution.

On this insulating layer 2, an under coating layer 3 is formed as with $SiO_2$ or β- SiAlON in a thickness approximately in the range of 0.05 to 1 μm. This undercoating layer 3 serves as a protective layer for the aromatic polyimide resin during the formation of a heat-generating resistors 4 layer in a prescribed shape by the etching treatment. On this undercoating layer 3 a multiplicity of heat-generating resistors 4 are formed as with $Ta-SiO_2$ or $Ti-SiO_2$ in a thickness of about 0.1 μm as spaced with a prescribed interval. On these heat-generating resistors 4, separate electrodes 6 and a common electrode 7 are formed with Al or Al-Si-Cu in a thickness approximately in the range of 0.7 to 1 μm in such a manner as to give rise to openings which serve as heat generating parts 5. A thermal head is completed by forming a combination oxidationproofing and abrasionproofing film 8 formed with a Si-O-N alloy in a thickness approximately in the range of 3 to 5 μm so as to cover at least the heat generating parts 5.

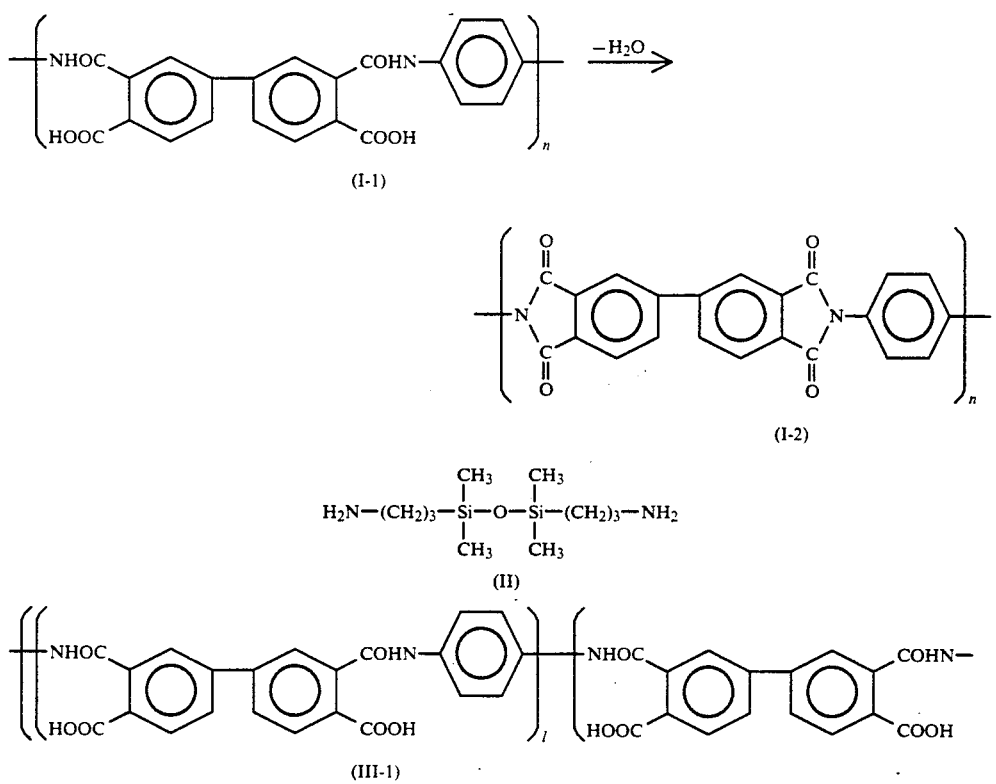

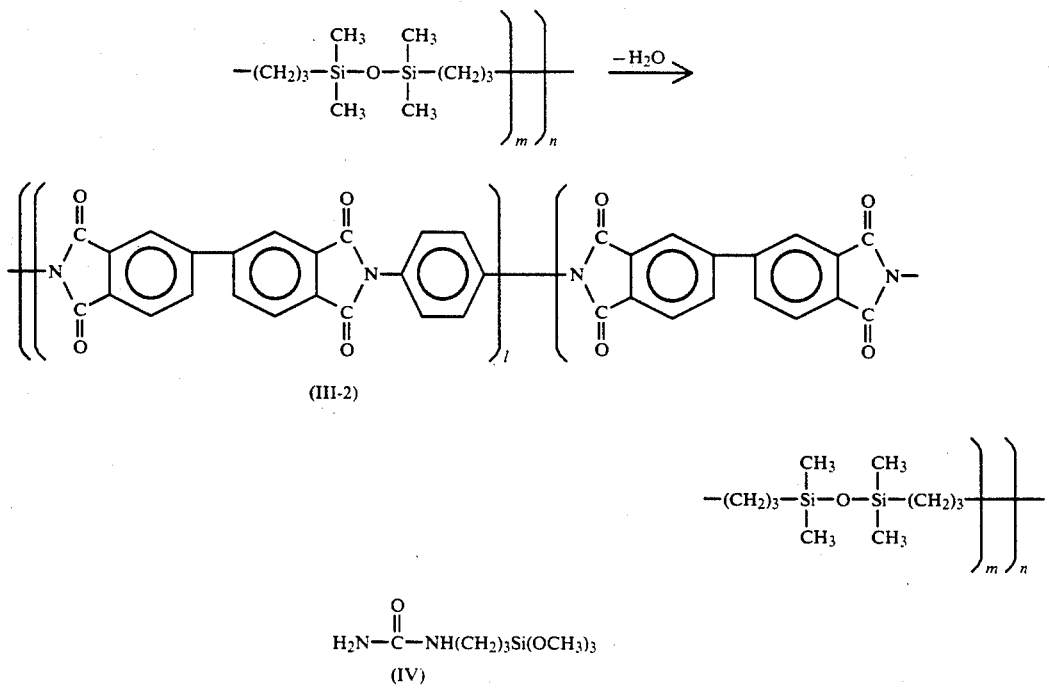

(III-2)

$$H_2N-\overset{O}{\underset{\|}{C}}-NH(CH_2)_3Si(OCH_3)_3 \quad (IV)$$

In the foregoing formulas, l, m, and n each stand for a positive number. (This denotation applies similarly hereinafter.)

In this thermal head, pulses of voltages separated by a fixed time interval are applied between the separate electrodes 6 and the common electrode 7 and the heat-generating resistors 4 corresponding to the relevant head generating parts 5 are consequently caused to generate heat to effect printing and recording.

This thermal head is manufactured, for example, as follows.

First, a metallic substrate formed with a Fe alloy containing 18% by weight of Cr and having a thickness of about 0.5 mm is subjected to a levelling treatment, then cut to a prescribed size, and ground to remove burrs. Then, the metallic substrate finished in the prescribed size is defatted in an organic solvent and subsequently soaked in a dilute sulfuric acid solution at a temperature in the range of 50° to 70° C., to produce a metallic substrate 1. This immersion in the dilute sulfuric acid solution is carried out for the purpose of activation through the removal of the oxide formed on the surface of the metallic substrate and microscopic coarsening of the surface. Then, the aforementioned polyamic acid solution, namely the polyamic acid solution represented by the formula (I-1) or the polyamic acid solution represented by the formula (III-1) or polyamic acid solution represented by the formula (I-1) having a silane coupling agent dispersed therein is adjusted to a prescribed viscosity with an organic solvent such as N-methyl-2-pyrrolidone, applied with a roller coater or a spin coater on the aforementioned metallic substrate 1 in an amount calculated to produce a dry layer in a prescribed thickness, and fired in a furnace filled with nitrogen gas under the conditions of 50° C.×60 minutes +80° C.×30 minutes +120° C.×30 minutes +250° C.×60 minutes +450° C.×60 minutes to expel the organic solvent and, at the same time, promote a dehydration cyclization reaction and induce imidization. Thus, an insulating layer 2 is produced. When a polyamic acid incorporating no silane coupling component therein or a polyamic acid having no Si group introduced in the molecular structure thereof is used during the formation of the aromatic polyimide resin layer, the aromatic polyimide resin layer is desired to be superposed on an active metal layer formed in advance on the surface of the metallic substrate 1 with Cr or Ti in a thickness approximately in the range of 0.05 to 1 μm by the method of vacuum deposition, for example.

Then, on this insulating layer 2, an undercoating layer of $SiO_2$ or β-SiAlON and a heat-generating resistors 4 layer of $Ta-SiO_2$ or $Ti-SiO_2$ are sequentially superposed by spattering or some other conventional film-forming method.

Further, on this heat-generating resistors 4 layer, a conductor layer destined to give rise to the separate electrodes 6 and the common electrode 7 is formed with Al or Al-Si-Cu, for example, by the same method as just mentioned. Now, the heat-generating resistors 4 layer and the conductor layer are subjected to a patterning treatment to form a multiplicity of regularly spaced heat-generating resistors 4 and the separate electrodes 6 and the common electrode 7. This patterning treatment is effected by first superposing on the conductor layer a masking film adapted to form the heat-generating resistors 4 in a prescribed shape and removing unnecessary portions from the conductor layer by wet-etching or chemical dry-etching, to form a conductor layer conforming to the multiplicity of regularly spaced heat-generating resistors 4. Then, the heat-generating parts 5 are formed and the separate electrodes 6 and the common electrode 7 are simultaneously produced by superposing a masking film on the conductor layer except for the portion destined to form the heat-generating parts 5 and then removing only the conductor layer by the same method as mentioned above. Thereafter, a combination oxdationproofing and abrasionproofing film 8 of a Si-O-N type composition is formed by the spattering method, for example, so as to cover the heat-generation parts 5.

During the course of manufacture of this thermal head, the aromatic polyimide resin which is the heat-resistant insulating coating material of the present invention was tested for such characteristic properties as adhesive strength and thermal resistance.

First, a polyamic acid solution obtained by the ring-opening polyaddition reaction of 3, 3', 4, 4'-biphenyl tetracarboxylic anhydride and p-phenylene diamine was applied on a Fe-18 wt % Cr alloy substrate having a Cr coating vacuum deposited thereon to produce an aromatic polyimide resin layer (Example 1). In an atmosphere of nitrogen gas, the resultant composite was subjected to a thermal stress test using ten cycles each consisting of the room temperature ×30 minutes and 450° C.×30 minutes to decide between presence and absence of the separation of the aromatic polyimide resin layer during the test. The composite was further tested for the temperature for starting thermal decomposition by the thermogravimetry and for thermal shrinkage and for linear thermal expansion coefficient. The results are shown in the following table. The test for thermal shrinkage was performed under the heating conditions of 400° C.×30 minutes and that for linear expansion coefficient was carried out with a microlinear expansion meter at a temperature increasing rate of 5° C./minute.

Separately, polyamic acids were synthesized by following the procedure of Example 1, excepting m-phenylene diamine (Example 2), diaminodiphenyl ether (Example 3), diaminodiphenyl sulfone (Example 4), and diaminodiphenyl methane (Example 5) were respectively used in the place of p-phenylene diamine. The polyamic acids were applied each on the same substrate under the same conditions as in Example 1 to produce polyimide resin layers. The resultant composites were similarly tested for the characteristic properties. The results were as shown in the following table.

As concerns the data given in the column "Comparative Experiment" of the table, polyamic acids were synthesized by using, as the aromatic diamine moiety, the same p-phenylene diamine as in Example 1 and, as the tetracarboxylic acid moiety, pyromellitic dianhydride (Comparative Experiment 1) and benzophenone tetracarboxylic dianhydride (Comparative Experiment 2) respectively and then processed to produce aromatic polyimide resin layers under the same conditions as in Example 1 and the aromatic polyimide resin layers were tested for characteristic properties in the same manner as in Example 1. In Comparative Experiment 3, an aromatic polyimide resin layer was obtained by using "Torayneece", a substance indicated in a working example cited in Japanese Patent Application Disclosure SHO 56(1981)-164,876. In Comparative Experiment 4, an aromatic polyimide resin layers, called "Pyre-ML", similarly tested for characteristic properties. The results are also shown in the following table.

TABLE

| | Structure of polyimide | Presence of separation | Thermal shrinkage (at 400° C.) | Thermal expansion coefficient (200–300° C.) | Temperature for starting thermal decomposition |
|---|---|---|---|---|---|
| Example | | | | | |
| 1 | [structure] | No | 0.2~0.5% | $1.5 \times 10^{-5}$ cm/cm/°C. | 550° C. |
| 2 | [structure] | Slightly | 0.5~1.0% | $2.5 \times 10^{-5}$ cm/cm/°C. | 530° C. |
| 3 | [structure] | Slightly | 1.0~1.3% | $3.0 \times 10^{-5}$ cm/cm/°C. | 510° C. |
| 4 | [structure] | Slightly | 1.5~2.0% | $4.5 \times 10^{-5}$ cm/cm/°C. | 505° C. |
| 5 | [structure] | Slightly | 1.2~1.7% | $4.3 \times 10^{-5}$ cm/cm/°C. | 500° C. |
| Comparative Experiment | | | | | |
| 1 | [structure] | Yes | 3.0~3.5% | $5.0 \times 10^{-5}$ cm/cm/°C. | 510° C. |

TABLE-continued

| Structure of polyimide | | Presence of separation | Thermal shrinkage (at 400° C.) | Thermal expansion coefficient (200-300° C.) | Temperature for starting thermal decomposition |
|---|---|---|---|---|---|
| 2 | (structure) | Yes | 3.0~3.5% | 5.0 × 10$^{-5}$ cm/cm/°C. | 515° C. |
| 3 | Torayneece | Yes | 3.0~3.5% | 5.0 × 10$^{-5}$ | 510° C. |
| 4 | Pyre - Ml. | Slightly | 2.0~3.0% | 2.5 × 10$^{-5}$ | 420° C. |

It is clearly noted from the foregoing table that the aromatic polyimide resins synthesized by using biphenyl tetracarboxylic dianhydrides as the tetracarboxylic acid moiety possessed smaller thermal shrinkages than the aromatic polyimide resins using other kinds of tetracarboxylic acid moiety and exhibited small linear expansion coefficients approximating the linear expansion coefficient of the metallic substrate and, therefore, experienced no or very little "separation" from the metallic substrate during exertion of thermal stress. The polyimide resin of Example 1 using p phenylene diamine as the aromatic diamine moiety possessed a particularly high heat-resisting temperature and showed the smallest difference of linear expansion coefficient from the metallic substrate and, therefore, more effectively precluded the "separation," a phenomenon believed to arise from difference in linear expansion coeffecient. The aromatic polyimide resins in the other working examples acquired adhesive strength enough for the resin to be used advantageously in a thermal head because the resin incorporated the aforementioned silane coupling agent for introduction of Si group in the molecular structure.

An aromatic polyimide resin formed by using 2, 2', 3, 3'-biphenyl tetracarboxylic dianhydride as the tetracarboxylic acid moiety in the same manner as in the working examples cited above showed a drop of about 20° C. in the temperature for starting thermal decomposition and exhibited other characteristic properties at substantially the same levels and, therefore, proved to be useful as an insulating layer in the thermal head. Other aromatic polyimide resins which used aromatic diamine possessing such substrates as methyl group and ethyl group showed no discernible difference in characteristic properties from the aromatic polyimide resins using unsubstituted aromatic diamines and proved to be similarly useful as an insulating layer in the thermal head. Then, aromatic polyimide resins having Si group introduced into the molecular structure thereof as represented by the formula (III-2) and aromatic polyimide resins represented by the formula (I-2) and incorporating therein, as a silane coupling agent moiety, γ-ureidopropyl trimethoxy silanes represented by the formula (IV) were tested for adhesive strength and heat-resisting property.

Figure 2:
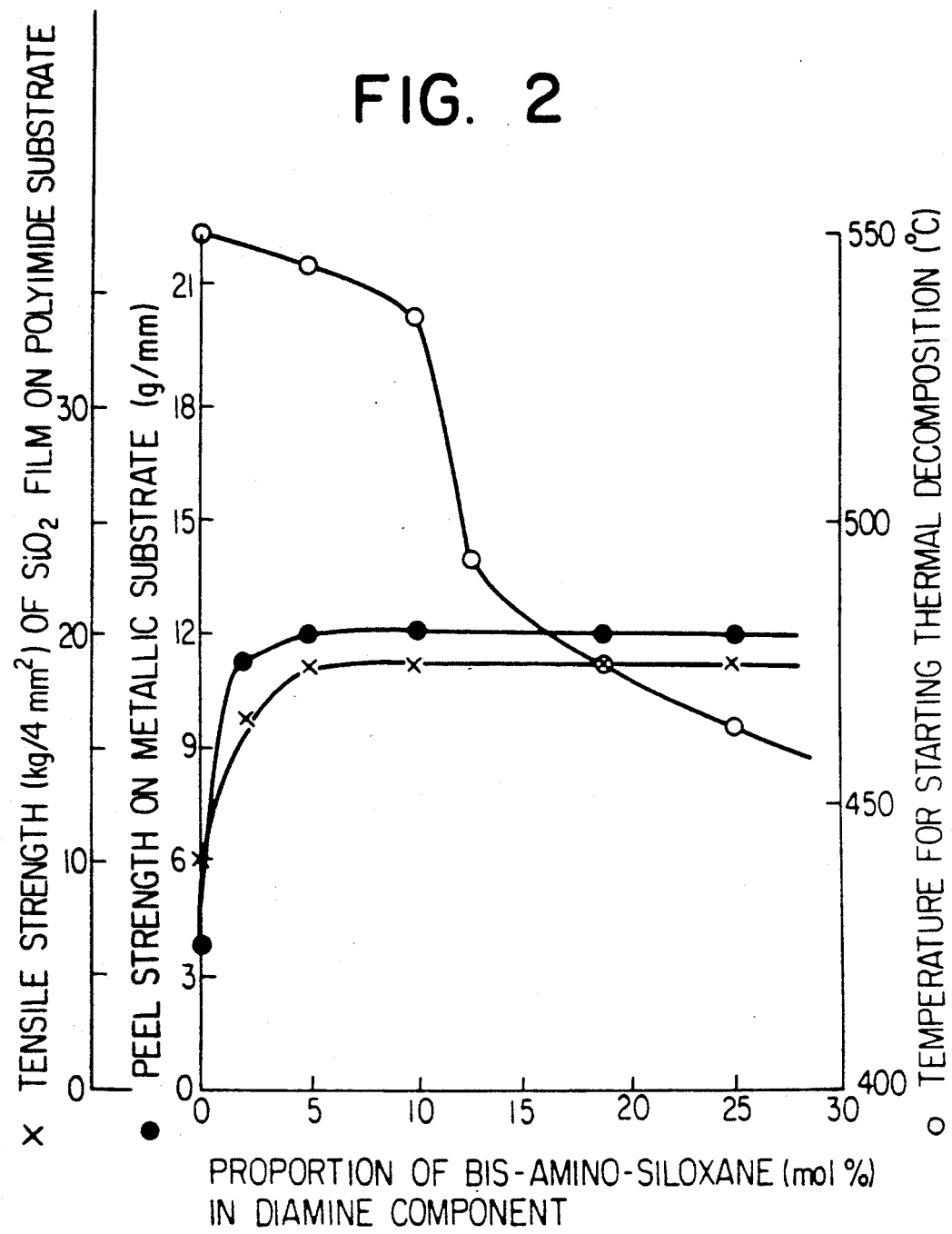
FIG. 2 is a graph showing the relation between the ratio of substitution of the p-phenylene diamine component with a diamino disiloxane during the formation of the aromatic polyimide resin according with the present invention and the adhesive strength exhibited by the aromatic polyimide resin layer to the undercoating layer formed on the metallic substrate and aromatic polyimide resin layer and the temperature at which the aromatic polyimide resin begins to undergo thermal decomposition.
Figure 3:
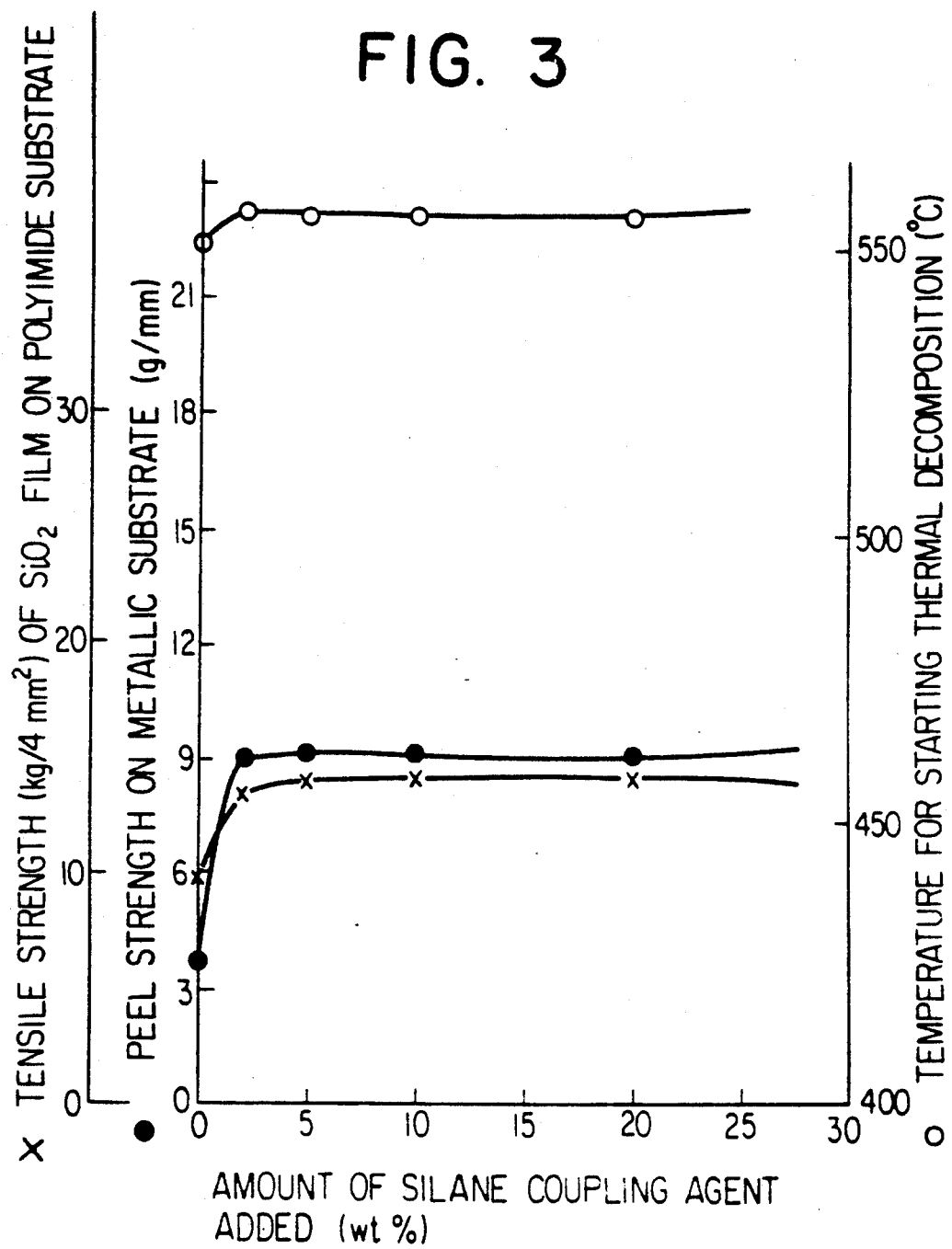
FIG. 3 is a graph showing the relation between the amount of the silane coupling agent added during the course of the formation of the aromatic polyimide resin according with this invention and the adhesive strength exhibited by the aromatic polyimide resin layer to the undercoating layer formed on the metallic substrate and aromatic polyimide resin layer and the temperature at which the aromatic polyimide resin begins to undergo thermal decomposition.

FIG. 2 is a diagram showing the relation between the ratio of substitution of the p-phenylene diamine moiety with the aforementioned bisaminodisiloxane and the adhesive strength exhibited to the metallic substrate (no vacuum deposited Cr layer) and the SiO$_2$ layer and the temperature for starting thermal decomposition. FIG. 3 is a diagram showing the relation between the amount of addition of the aforementioned silane coupling agent (expressed in % by weight, based on the solids content of the polyamic acid solution) and the adhesive strength exhibited to the metallic substrate (no vacuum deposited Cr layer) and the SiO$_2$ layer and the temperature for starting thermal decomposition. The adhesive strength of the aromatic polyimide resin layer to the metallic substrate was determined in accordance with the method "repping strength" specified by Japanese Industrial Standard (JIS) 06481.5.7. The adhesive strength of the aromatic polyimide resin layer to the SiO$_2$ layer was determined as follows. On the SiO$_2$ layer deposited on the aromatic polyimide resin layer, Al, Cr, Cu, and Au were sequentially superposed in respective thicknesses of 1 μm, 0.1 μm, 3 μm, and 1 μm by mask spattering. Then the portion of the SiO$_2$ layer not covered with these metal layers was removed by chemical dry-etching. Subsequently, Sn-plated Cu wires were joined by soldering to the Cu layer. The adhesive strength was determined by carrying out a tensile test making use of the Cu wires.

It is noted that in all the examples, the adhesive strength was improved to a great extent by the incorporation of Si component.

The heat-generating resistors of the thermal head are operated instantaneously at temperatures in the range of 400° to 500° C. and continuously at temperatures in the range of 250° to 350° C. From the results of FIG. 2, it is noted that the ratio of substitution with bisamino siloxane is desired to fall approximately in the range of 0.05 to 10 mol %. This range is important for the following reason. If the ratio of substitution with bisamino-siloxane is less than about 0.05 mol %, no discernible effect is brought about in the improvement of adhesive strength. Conversely, if this ratio exceeds about 10 mol %, the effect in the improvement of adhesive strength is saturated and the thermal resistance is seriously degraded. From the results of FIG. 3, it is noted that the amount of the silane coupling agent to be added is desired to fall approximately in the range of 0.05 to 10% by weight. This range is important for the following reason. If the amount of the silane compound agent added is less than about 0.05% by weight, no discernible effect is brought about in the improvement of adhesive strength. If this ratio conversely exceeds about 10% by weight, the effect produced in the improvement of adhesive strength is saturated.

As the silane coupling agent component, the γ-aminopropyl trimethoxy silanes represented by the following formula (VI) and the N-phenyl-γ-aminopropyl trimethoxy silanes represented by the formula (VII) are usable as effectively as the aforementioned γ-ureidopropyl trimethoxy silane.

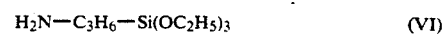

$$H_2N-C_3H_6-Si(OC_2H_5)_3 \qquad (VI)$$

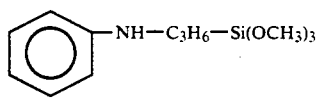

(VII)

The adhesive strength of the aromatic polyimide resin to the metallic substrate or to the inorganic insulating layer serving as an undercoating layer is further enhanced by introducing Si group into the molecular structure of the resin or by causing the resin to incorporate therein a silane coupling agent component as described above. The use of this aromatic polyimide resin, therefore, permits production of a thermal head of highly desirable reliability. Particularly when the aromatic polyimide resin is allowed to introduce Si group in a specific amount into the molecular structure thereof, it forms a highly desirable insulating layer for the thermal head because the adhesive strength is enhanced in a great measure with virtually no sacrifice of the heat-resisting property.

The thermal head was tested for operational efficiency.

First, a thermal head of the conventional principle was produced by depositing on an alumina ceramic substrate a glazed glass layer formed with $SiO_2$-BaO-CaO-$Al_2O_3$-$B_2O_3$-ZnO in a thickness of about 70 μm and then superposing thereon an undercoating layer, heat-generating resistors, electrodes, and a protective layer in the same way as in the foregoing working example. This thermal head using the glazed glass was used in the printing operation to find the input power required in producing a prescribed coloring density. Then, the thermal heads severally using aromatic polyimide resin layer represented by the formula (I-2) and the aromatic polyimide resin layer represented by the formula (III-2), both involved in the working examples cited above, and the aromatic polyimide resin represented by the formula (I-2) and having a silane coupling agent contained therein were used in the printing operation to find the input powers required in producing the same coloring density. A graph obtained by plotting the input power ratio (based on the input power of the thermal head using the glazed glass taken as unity, 1) vs. the wall thickness of the polyimide resin layer is shown in FIG. 4.

Figure 4:
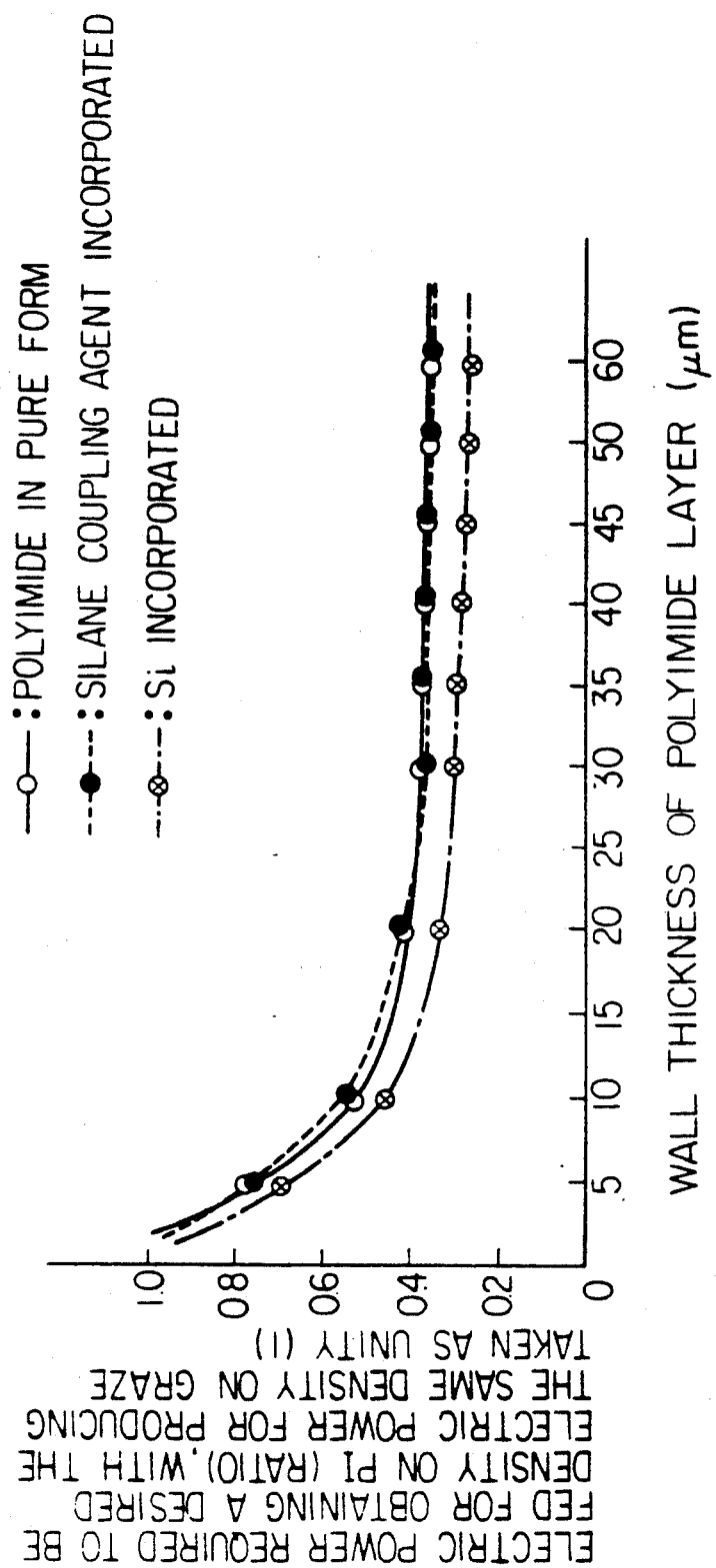
FIG. 4 is a graph showing the efficiency of a thermal head using the conventional grazed glass as an insulating layer as compared with the efficiency of a thermal head indicated in a working example of the present invention.

It is clearly noted from FIG. 4 that when the aromatic polyimide resin of the present invention was used as an insulating layer, a lower input power sufficed in obtaining the same degree of coloring density as when the glazed glass was used, indication that the aromatic polyimide resin far excels the glazed glass in terms of thermal efficiency. It is further noted from the results of FIG. 4 that the thickness of the polyimide resin layer is desired to be approximately in the range of 5 to 50 μm. This range is important for the following reason. If this thickness is less than about 5 μm, the effect in the improvement of efficiency is not obtained sufficiently. If the thickness exceeds about 50 μm, this effect is saturated.

Figure 5:
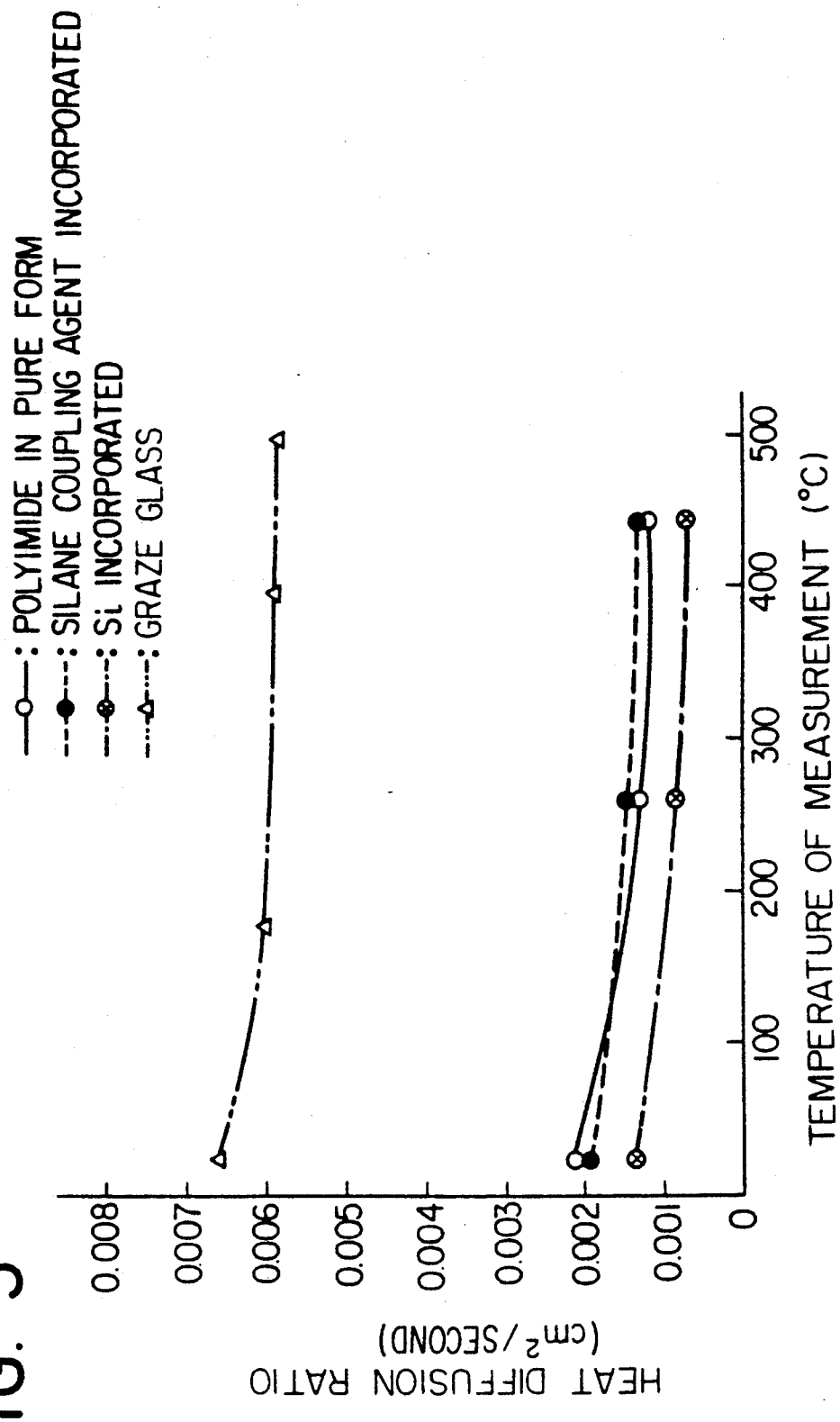
FIG. 5 is a graph showing the thermal diffusion coefficient of the aromatic polyimide resin of the present invention and the grazed glass.

FIG. 5 shows the thermal diffusion coefficients in the direction of thickness determined by the laser flush method with respect to the same three aromatic polyimide resin and the same glazed glass as used in the aforementioned test for thermal efficiency, for the purpose of acquiring basic knowledge as to the cause for the improvement in efficiency. It is clear from FIG. 5 that the aromatic polyimide resin of the present invention possesses a thermal diffusion coefficient roughly one tenth of that of the conventional glazed glass and, therefore, permits formation of a thermal head of proportionately high efficiency. When Si group is introduced into the molecular structure of the aromatic polyimide resin, the thermal diffusion coefficient is lowered and, therefore, the efficiency is expected to be improved.

Figure 6:
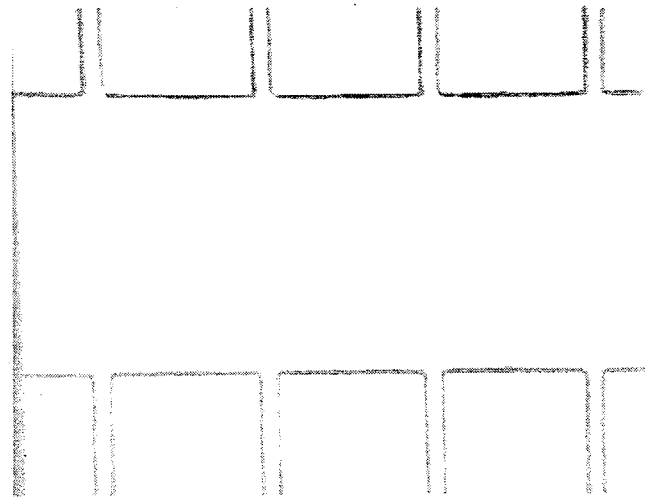
FIG. 6 is a photomicrograph of the surface of an aromatic polyimide resin layer in a thermal head used in one working example of this invention, which was taken through a scanning acoustic microscope after the thermal head had been used in the test application of pulse voltage.
Figure 7:
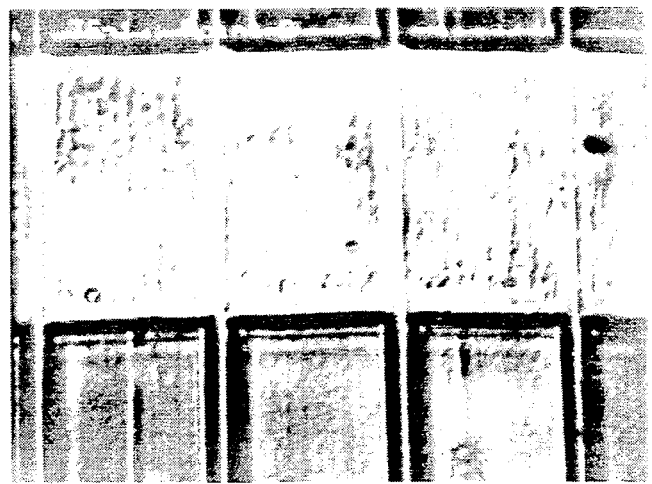
FIG. 7 is a photomicrograph of the surface of a conventional aromatic polyimide resin layer in a thermal head, which was taken through a scanning acoustic microscope after the thermal head had been used in the test application of pulse voltage.

The thermal head produced in the example was operated for test application of $10^8$ pulses of voltage under the conditions of 0.26 mJ/dot of application energy, 1.7 ms of pulse width, and 5.0 ms of pulse cycle. At the end of this operation, the surface of the aromatic polyimide resin layer was observed under a scanning acoustic microscope. The photomicrograph thus obtained is shown in FIG. 6. It is clearly noted from this photograph that the application of pulses of voltage brought about absolutely no discernible degeneration in the aromatic polyimide resin.

Though the example was described as having used the biphenyl tetracarboxylic dianhydride and the aromatic diamine in equimolar amounts, this invention is not limited to this particular molar ratio. The mixing ratio of the two components mentioned above may be varied so long as the heat-resisting property and the viscosity during the couse of manufacture fall within the permissible ranges.

As described above, the aromatic polyimide resin according with the present invention possesses the heat-resisting property enough to withstand the harsh working temperature conditions and, at the same time, excels in adhesive strength. The thermal head which used this aromatic polyimide resin as an insulating layer, therefore, enjoys highly desirable reliability and excels in thermal efficiency making ample use of the characteristic properties of the polyimide resin. This thermal head is inexpensive and is capable of size reduction.

The aromatic polyimide resin proves to be highly useful because it exhibits highly desirable adhesive strength to metallic parts not only when it is used for the insulating layer in the thermal head but also when it is used as the heat-resistant insulating coating material for various electronic devices such as, for example, the insulating layer in the multilayer distribution board for hybrid IC's.

What is claimed is:

1. A heat-resistant insulating coating material for use in the construction of a thermal head, said material being formed substantially with an aromatic polyimide resin produced by the dehydration cyclization reaction of a polyamic acid obtained by the ring-opening polyaddition reaction of substantially equimolar amounts of a biphenyl tetracarboxylic dianhydride and an aromatic diamine, wherein said polyamic acid incorporates therein at least either a silane compound possessing an amino bond as a silane coupling agent component or a silane compound possessing a urea bond as a silane coupling agent.

2. The heat-resistant insulating coating material according to claim 1, wherein the amount of said silane coupling agent component to be added is in the range of 0.05 to 10% by weight, based on the solids content of said polyamic acid.

3. The heat-resistant insulating coating material according to claim 1, wherein said amino bond-containing silane compound is either γ-aminopropyl triethoxy silane or N-phenyl-γ-aminopropyl trimethoxy silane.

4. The heat-resistant insulating coating material according to claim 1, wherein said urea bond-containint silane compound is γ-ureidopropyl trimethoxy silane.

5. The heat-resistant insulating coating material according to claim 1, wherein said aromatic diamine is p-phenylene diamine.

6. The heat-resistant insulating coating material according to claim 5, wherein the amount of said silane coupling agent component to be added is in the range of 0.05 to 10% by weight, based on the solids content of said polyamic acid.

7. The heat-resistant insulating coating material according to claim 5, wherein said amino bond-containing silane compound is either γ-aminopropyl triethoxy silane or N-phenyl-γ-aminopropyl trimethoxy silane.

8. The heat-resistant insulating coating material according to claim 5, wherein said urea bond-containing silane compound is γ-ureidopropyl trimethoxy silane.

* * * * *